(12) United States Patent
Mosely et al.

(10) Patent No.: US 6,430,458 B1
(45) Date of Patent: *Aug. 6, 2002

(54) SEMI-SELECTIVE CHEMICAL VAPOR DEPOSITION

(75) Inventors: Roderick Craig Mosely, Pleasanton; Liang-Yuh Chen, San Jose; Ted Guo, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/371,617

(22) Filed: Aug. 10, 1999

Related U.S. Application Data

(62) Division of application No. 08/718,656, filed on Sep. 23, 1996.

(51) Int. Cl.[7] .................................. B05D 1/14
(52) U.S. Cl. ..................... 700/121; 427/258; 427/250; 700/182
(58) Field of Search ............... 700/121; 438/641, 438/637, 675, 674; 427/250, 255, 258, 248.1, 255.1, 255.4, 314, 255.28; 118/715

(56) References Cited

U.S. PATENT DOCUMENTS

| | | | |
|---|---|---|---|
| 4,381,595 A | 5/1983 | Denda et al. ................ | 438/624 |
| 4,884,123 A | 11/1989 | Dixit et al. .................. | 437/195 |
| 4,897,709 A * | 1/1990 | Yokoyama et al. ........... | 357/68 |
| 4,920,073 A | 4/1990 | Wei et al. .................... | 437/192 |
| 4,938,996 A | 7/1990 | Ziv et al. ...................... | 357/71 |
| 4,960,732 A | 10/1990 | Dixit et al. .................... | 427/53 |
| 4,985,750 A | 1/1991 | Hoshino ....................... | 437/192 |
| 4,987,099 A | 1/1991 | Flanner ........................ | 357/71 |
| 4,994,410 A | 2/1991 | Sun et al. .................... | 437/192 |
| 5,091,339 A | 2/1992 | Carey .......................... | 437/187 |
| 5,100,501 A | 3/1992 | Blumenthal et al. .......... | 216/18 |
| 5,110,759 A * | 5/1992 | Mukai ........................ | 431/173 |

(List continued on next page.)

FOREIGN PATENT DOCUMENTS

| | | |
|---|---|---|
| DE | 3743591 A1 | 7/1988 |
| EP | 0566253 A1 | 10/1993 |
| JP | 63-9925 | 1/1988 |
| JP | 6-232077 | 8/1994 |
| JP | 8-10693 | 1/1996 |
| JP | 2513900 | 4/1996 |

OTHER PUBLICATIONS

European Search Report Dated Jun. 18, 1999.

Search and Examination Report for Singapore Application No. 9703453–2 dated Oct. 3, 1998.

Granneman, E. H. A., "Multi–Level Metallization: Future Prospects," European Transactions On Telecommunications and Related Technologies, vol. 1, No. 2, Mar./Apr. 1990.

*Primary Examiner*—Leo Picard
*Assistant Examiner*—Kidest Bahta
(74) *Attorney, Agent, or Firm*—Moser, Patterson & Sheridan LLP

(57) ABSTRACT

The present invention is an apparatus and method for semi-selectively depositing a material on a substrate by chemical vapor deposition to form continuous, void-free contact holes or vias in sub-half micron applications. An insulating layer is preferentially deposited on the field of a substrate to delay or inhibit nucleation of metal on the field. A CVD metal is then deposited onto the substrate and grows selectively in the contact hole or via where a barrier layer serves as a nucleation layer. The process is preferably carried out in a multi-chamber system that includes both PVD and CVD processing chambers so that once the substrate is introduced into a vacuum environment, the filling of contact holes and vias occurs without the formation of an oxide layer on a patterned substrate.

20 Claims, 5 Drawing Sheets

U.S. PATENT DOCUMENTS

| | | |
|---|---|---|
| 5,147,819 A | 9/1992 | Yu et al. |
| 5,192,714 A | 3/1993 | Suguro et al. ............... 437/173 |
| 5,250,465 A | 10/1993 | Iizuka et al. ................. 437/195 |
| 5,266,521 A * | 11/1993 | Lee et al. ................... 437/188 |
| 5,300,455 A * | 4/1994 | Vuillermoz et al. ......... 437/190 |
| 5,354,712 A | 10/1994 | Ho et al. .................... 437/173 |
| 5,429,991 A | 7/1995 | Iwasaki et al. ............. 437/195 |
| 5,480,836 A | 1/1996 | Harada et al. ............... 437/192 |
| 5,514,425 A | 5/1996 | Ito et al. ...................... 437/192 |
| 5,534,462 A | 7/1996 | Fiordalice et al. .......... 427/534 |
| 5,567,987 A | 10/1996 | Lee ............................. 437/190 |
| 5,585,308 A | 12/1996 | Sardella ...................... 437/190 |
| 5,585,637 A * | 12/1996 | Joshi et al. .................. 257/751 |
| 5,585,673 A | 12/1996 | Joshi et al. .................. 257/751 |
| 5,618,756 A | 4/1997 | Chew et al. ................ 438/586 |

* cited by examiner

SEMI-SELECTIVE CHEMICAL VAPOR DEPOSITION

This is a divisional of copending application(s) Ser. No. 08/718,656 filed on Sep. 23, 1996.

FIELD OF THE INVENTION

The present invention relates to an apparatus and method for at least semi-selectively depositing a material on a substrate by chemical vapor deposition. More particularly, the present invention relates to filling high aspect ratio vias, holes and contacts in a substrate by deposition of a metal interconnect layer.

BACKGROUND OF THE INVENTION

In integrated circuit fabrication, electrically conductive, metal-containing material is deposited onto substrates to form interconnect lines and/or fill contact holes and vias, which are used to electrically connect active devices formed on substrates. The metal-containing interconnect lines are typically formed by sequentially (I) depositing layers of electromigration, diffusion barrier, electrical conductor, and/or antireflective materials, on the substrate, (ii) forming a patterned resist layer on the deposited layers, and (iii) etching the unprotected portions of the deposited layers to form the interconnect lines. An electrical insulator layer, such as silicon dioxide, is deposited over the interconnect lines to electrically isolate the interconnect lines. Contact holes or vias are etched through the insulator layer to expose underlying interconnect lines, or to expose semiconductor devices such as gates. The contact holes or vias are filled with additional metal-containing material to form plugs that connect the devices and interconnect lines formed on the substrate.

Conventional chemical vapor deposition (CVD) and physical vapor deposition (PVD) techniques are used to deposit electrically conductive material into the contact holes and vias formed on the substrate. One problem with conventional processes arises because the contact holes or vias comprise high aspect ratios, i.e., the ratio of the height of the holes to their width or diameter is greater than 1. The aspect ratio of the holes increases as advances in technology yield more closely spaced features.

Referring to FIG. 1, a substrate 10 comprises a hole 11 formed within an electrically insulative or dielectric layer 12, such as for example, silicon dioxide or silicon nitride. It is difficult to deposit a uniform metal-containing layer 13 into the high aspect ratio hole 11 using chemical vapor deposition processes because the metal-containing layer 13 often preferentially deposits on the sidewalls 14 of the holes and across the width of the hole to eventually converge and form voids and discontinuities 15 within the metal-containing material 13. Thereafter, the high mobility of metal atoms, such as aluminum atoms, surrounding the voids causes the atoms to diffuse and minimize the surface area of the voids forming circular shaped voids 15 as shown in FIG. 1. These voids and discontinuities 15 result in poor and unreliable electrical contacts.

One traditional CVD method used to fill contact holes and vias is selective CVD, wherein the chemical vapor nucleates, i.e., the deposition process begins at selected nucleation sites on the wafer. The usefulness of selective chemical vapor deposition of Al or other metals is limited due to the inability to effectively clean the via interface during a pre-cleaning step. $SiO_2$ deposited in the via bottom inhibits selective nucleation and selective CVD metal via fill. This loss of selectivity results in a corresponding formation of a void inside the via and a drop in via yield. As aspect ratios increase, the via Ar+ flux, or other pre-clean flux, reaching the via bottom decreases, thereby reducing the effectiveness of sputter etch removal of $Al_2O_3$ which typically forms on the substrate surface when the substrate is exposed to ambient conditions. To effectively remove the $Al_2O_3$, longer etch times are required which decreases throughput of substrates in the system. In addition, as the etch times are increased, the fraction of material sputtered from the via corner increases proportionally as does the resulting $SiO_2$ sputter flux deposition onto the via interface.

Liner processes have been developed to resolve the limitations of the selective CVD process. A liner, such as titanium (Ti) or titanium nitride (TiN), is deposited on a patterned substrate to provide a nucleation layer and a wetting layer over which deposition can proceed. The liner process overcomes limitations of the selective process by reducing the oxide interface at the via bottom with a thin layer of sputtered Ti or TiN. However, selectivity is lost since the Ti or TiN is also deposited on the via sidewall and substrate field surfaces. Therefore, selective CVD cannot be used to fill the aperture, so a thin conformal CVD Al is deposited into the aperture to form a liner. The Al liner is then covered with a PVD metal layer, such as aluminum. The substrate 10 is then heated to reflow temperatures causing the deposited aluminum to flow into the bottom of the contact holes and/or vias. However, because the PVD aluminum layer is only deposited on portions of the substrate 10 due to the limitations imposed by very small geometries, the layer must be heated to temperatures of about 400° C. to about 550° C., in order to provide a sufficiently low viscosity metal layer that flows into the holes 11 in the substrate 10. Such high temperatures limit the PVD and reflow techniques to only those where the substrates are not damaged by the high temperatures. For example, temperatures above 400° C. can cause diffusion of dopant material and/or decomposition of the substrate. New generations of ever miniaturized integrated circuits require low processing temperatures to obtain the required levels of miniaturization, and to allow use of low temperature materials that are often unstable at temperatures exceeding 400° C. In addition, as the aspect ratio increases, the thermal budget and resulting throughput is decreased. While the liner integration sequence provides cost, thermal budget and throughput improvements compared to traditional hot AlCu processing, it is still expensive relative to a selective sequence.

Conventional PVD methods, such as sputtering, also have problems that result because material sputtered off a sputtering target by energetic plasma ions travels to the substrate 10 in a relatively straight-line path to deposit primarily on those portions of the substrate within line-of-sight of the target. The line-of-sight deposition makes it difficult to fill high aspect ratio contact holes or vias that have an aspect ratio exceeding 1. Often, less than 5% of the material deposited by conventional PVD processes is formed within the holes 11, the remaining deposits being formed on top of the features adjacent to the holes 11.

Another problem with conventional deposition processes arises because such methods deposit crystalline grains 16 having random crystalline orientation which negatively affect electromigration performance. Highly oriented crystals, on the other hand, can reduce electromigration of the atoms within the crystal. Electromigration is a diffusive process in which atoms diffuse from one region to another region within the deposited layer under the influence of electrical fields across the substrate, causing voids that result in "open" junctions and unreliable electrical conductivity. Conductive layers having a highly oriented crystalline structure exhibit reduced electromigration of atoms, because in certain crystallographic orientations, the conductive layers have lower diffusion coefficients. For example, deposited aluminum grains that are highly oriented in the crystallographic plane having <111> miller indices are found to exhibit excellent resistance to electromigratory diffusion. However, conventional deposition processes typically deposit more randomly oriented crystalline grains 16 on the substrate. This limits the current density that a conductive plug or interconnect line can carry to typically about $10^6$ $A/cm^2$, beyond which excessive electromigration would occur.

The randomly oriented crystalline grains provided by conventional CVD and PVD processes can also result in deposition of layers having non-planar surfaces, which is undesirable for modern VLSI circuits that use multiple layers of submicron sized features to form high speed circuits. The surface 17 of the filled holes 11 in such circuits need to be planar and flat in order to accurately fabricate high density miniaturized features using conventional photolithographic processes. Conventional CVD deposition processes form a deposition layer having irregular ridges 18 on features adjacent to the holes 11 that result in an uneven and irregular surface 17, as shown in FIG. 1. The uneven deposition layers produce unfocussed or blurred resist patterns in the photo lithographic process, and on being etched, provide features having irregular line widths.

Thus, there is a need for a process for filling high aspect ratio contact holes and vias in a substrate with metal-containing material, without forming voids or defects in the deposited material. It is also desirable for the deposition process to deposit grains that are highly oriented in particular crystallographic planes.

SUMMARY OF THE INVENTION

The present invention provides a chemical vapor deposition process for at least semi-selectively depositing a substantially planar, highly reflective layer on a substrate, and is particularly useful for filling high aspect ratio holes formed on the substrate. A patterned substrate having a conductive or semi-conductive barrier layer formed thereon is positioned in a process zone, and an insulating layer is preferentially deposited on the field of the substrate. In one embodiment, the insulating layer is deposited by introducing nitrogen ($N_2$) and dimethyl aluminum hydride (DMAH) into the process zone to preferentially deposit a layer of AlN on the field of the substrate to the exclusion of the contact holes and vias. Thereafter, a metal layer is selectively deposited in the contact holes and vias using CVD processes. Preferably, a thin, self-aligning nucleation layer is deposited on the field of the substrate over the insulating film to provide controlled deposition on the field of the substrate so that deposition on the field proceeds at a slower rate than deposition in the contact holes and vias. Alternatively, a warm metal layer, preferably >250° C., may be deposited on the CVD metal layer to overcome the selectivity loss on the field by depositing a blanket layer on the field. In addition, AlCu or other doped material may be deposited over the CVD metal layer to allow migration of the Cu or other dopant throughout the metal layer.

Other insulating layers may be preferentially deposited and may comprise materials such as SiN, $TiO_2$, combinations thereof, or any other insulating material which can be deposited on the field of a substrate. Further, while Al is a preferred CVD metal layer, Cu or any other CVD metal may be semi-selectively deposited in the contact holes or vias.

Another aspect of the present invention includes the control system for operating a process chamber for depositing a substantially planar, highly reflective layer on the substrate. The computer product comprises a computer usable medium having computer readable program code means. The computer code means comprises:

(a) substrate positioning code for positioning the substrate in the chamber, (b) heater control code for operating a heater; and (c) process gas control for (I) in an insulating deposition mode, introducing one or more reactive gases into the process zone to preferentially deposit an insulating film, and (ii) in a subsequent selective deposition mode, introducing one or more deposition gases into the process zone to selectively deposit a metal-containing layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF THE INVENTION

The present invention generally provides a method and apparatus for selectively or semi-selectively depositing a conducting or semi-conducting layer 34 in a contact hole or via 20 by a chemical vapor deposition process. More particularly, the present invention provides an apparatus and method for selectively or semi-selectively filling a contact hole or via 20 by first preferentially depositing an insulating layer 22 on the field of a patterned substrate and then selectively or semi-selectively depositing a CVD metal layer 34 in the contact hole or via 20. An ultra thin, self-aligning nucleation layer 25 is preferably deposited on the insulating layer 22 prior to the deposition of the CVD metal layer 34 to control the incubation delay in the field and provide controlled deposition of a highly-oriented blanket layer on the field at a slower rate than the selective or semi-selective deposition which occurs in the contact hole or via 20. In addition, AlCu or other doped material may be deposited over the CVD metal layer 34 to allow migration of the Cu or other dopant throughout the metal layer. The method and apparatus are particularly suitable for depositing a layer of highly oriented crystals of electrically conductive material into high aspect ratio contact holes and vias etched through insulative layers (such as silicon oxide, phosphosilicate glass (PSG) or borophosphosilicate glass (BPSG) layers) having a conductive or semi-conductive barrier layer formed thereon.

Figure 1:
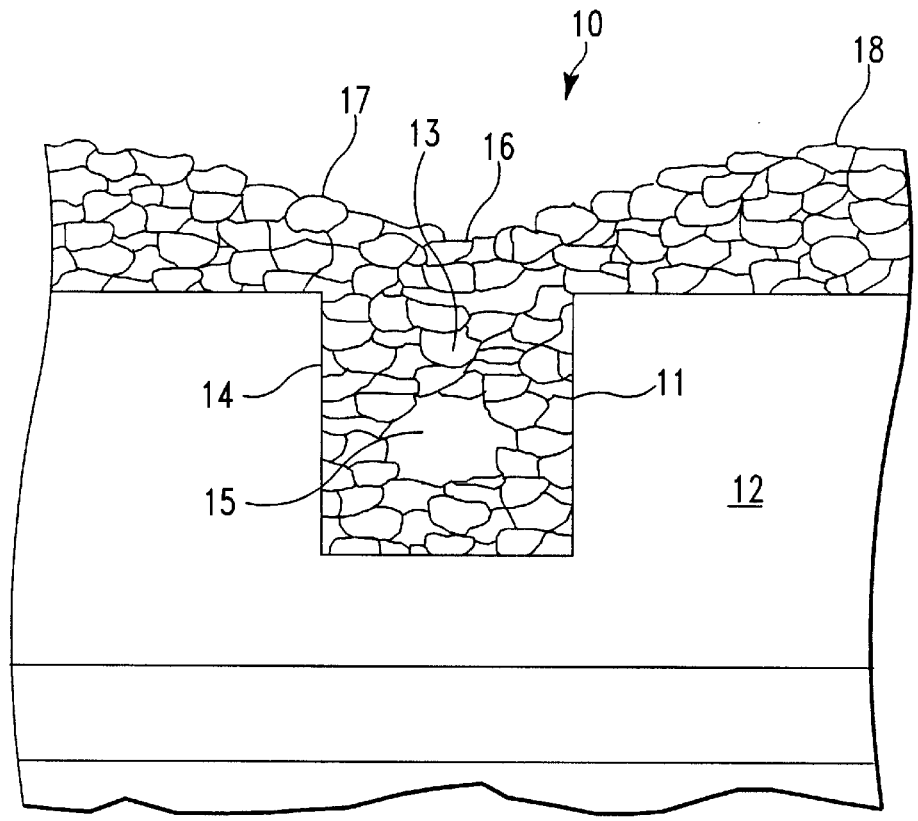
FIG. 1 is a schematic partial sectional view of a prior art substrate showing a randomly-oriented, fine-grained, granular deposition layer in an etched contact hole in the substrate with voids, discontinuities and a non-planar surface having a patterned dielectric layer thereon.
Figure 2:
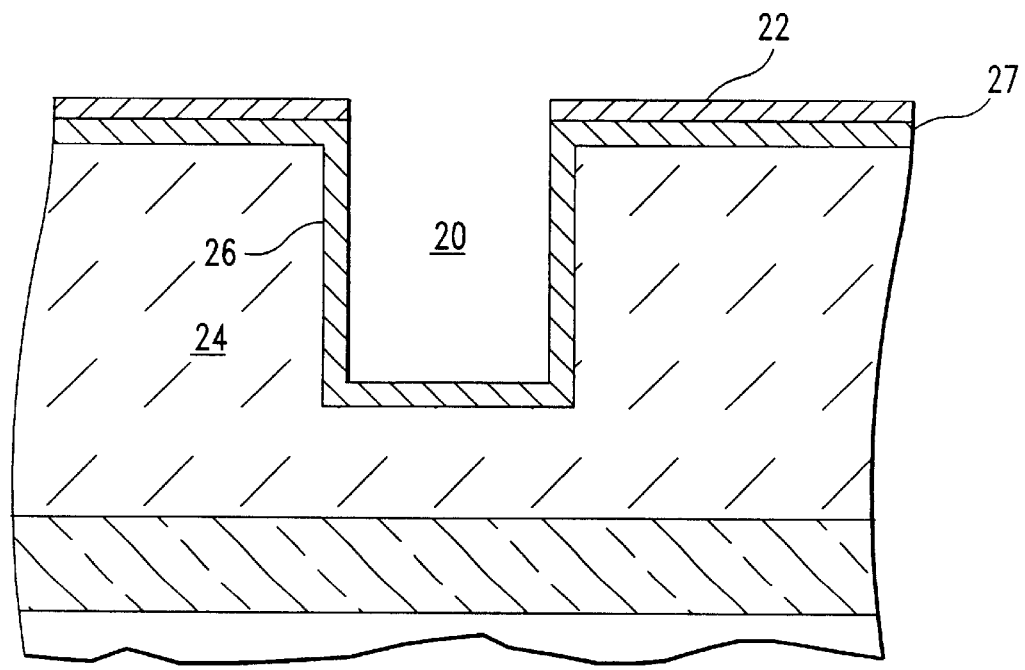
FIG. 2 is a schematic partial sectional view of a substrate processed according to the present invention showing a barrier layer deposited on the substrate.

In one embodiment of the present invention, the selective nature of aluminum (Al) deposition from thermal reduction of dimethyl aluminum hydride (DMAH) on AlN may be utilized in sequencing in conjunction with directional deposition steps to control the local rate of growth of CVD Al on a patterned substrate. Referring to FIG. 2, according to one method of the present invention, a substrate having a barrier layer 27, such as Ti or TiN, deposited thereon is positioned in a process zone in a CVD chamber and an insulating layer 22 is selectively formed, preferably by introducing $N_2$ into an ambient chamber prior to deposition of the CVD conducting film. The insulating layer deposited is preferably about 5 to about 100 Å thick and is deposited using a CVD process. Preferably, in the process for forming the insulating layer, the CVD reaction readily forms a layer on the Ti or TiN surface, but does not readily nucleate on the material at the base and sidewalls of the aperture. The chamber is maintained at a pressure in the range from about 1 Torr to about 100 Torr and nitrogen is introduced into the chamber at a rate of about 100 to about 300 sccm for about 10 to about 20 seconds. DMAH is introduced into the chamber along with or immediately after the $N_2$ is introduced to react with the $N_2$ background gas and selectively deposit an insulative AlN layer on the field. Once a background environment of nitrogen gas is introduced into the chamber, the nitrogen supply is then stopped and DMAH is continually introduced into the chamber. The nitrogen will react until used up to deposit the AlN layer. The thickness of the AlN layer is thus controlled by selecting the total nitrogen introduced into the chamber. Hydrogen is then introduced into the chamber to react with the DMAH resulting in the selective deposition of Al in the contact holes and vias, with preferred or enhanced deposition proceeding from the contact hole or via bottom upwardly. The CVD metal layer is preferably deposited at a wafer temperature initially from about 300° C. to about 400° C.

The preferred reaction for deposition of the insulating layer is the reaction of DMAH and $N_2$ according to the following equation:

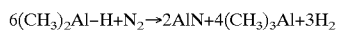

$$6(CH_3)_2Al-H+N_2 \rightarrow 2AlN+4(CH_3)_3Al+3H_2$$

The preferred reaction for deposition of the CVD metal layer is the thermal reduction of DMAH according to the following equation:

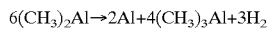

$$6(CH_3)_2Al \rightarrow 2Al+4(CH_3)_3Al+3H_2$$

The deposition rate may be tailored to provide a high rate of growth in the contact hole or via and a slow rate in the field and sidewall of the aperture by adjusting both the pressure in the chamber and the flow rate of nitrogen. While Al is one preferred CVD metal layer, other metals such as copper (Cu) and the like may also be deposited in accordance with the methods of the present invention.

In another embodiment, the insulating layer may be formed by depositing a thin PVD metal layer, such as Al, on the field of the substrate. Nitrogen may subsequently be introduced into the chamber and a nitrogen plasma generated to enhance the reaction of Al with nitrogen to form a thin AlN layer on the field. The thin metal PVD layer may be deposited according to methods set forth in copending, commonly assigned U.S. patent application Ser. No. 08/622,941, which is incorporated herein by reference.

While AlN is the preferred insulating layer, other insulating materials, such as $TiO_2$, SiN or any other insulating material, may also be used to advantage according to methods of the present invention. For example, SiN can be deposited by introducing silane ($SiH_4$) and ammonia ($NH_3$) or $N_2$ into the chamber to deposit a thin SiN layer prior to introduction of the CVD metal reactant gases into the chamber. $TiO_2$ can be deposited on the field of the substrate by sputtering a titanium target using PVD techniques and introducing oxygen into the chamber following the PVD process to react with the Ti layer to form $TiO_2$. The oxygen may be excited to a plasma state to enhance the reaction of the Ti layer and oxygen.

The insulating layer is preferably deposited on the field of the substrate using a chemical or physical vapor deposition process, most preferably a chemical vapor deposition process so that deposition of the insulating layer and the CVD metal layer can be carried out in the same chamber.

The deposition of the insulating layer is preferably optimized in thickness and in direction to reduce the likelihood that the insulating layer will be deposited on the bottom of the contact hole or via 20. Preferably, the insulating layer is deposited on a previously formed barrier layer 27, such as Ti, TiN or Al or other barrier layer used in the industry using directional techniques such as collimated physical vapor deposition to ensure good ohmic contact at the Si or via interface. The barrier layer 27 is preferably a conductor or semiconductor which acts as a nucleation film for the subsequent selective deposition of the CVD metal layer in the contact holes or vias 20. The barrier layer 27 preferably has a thickness of from about 50 to about 300 Å, preferably from about 80 to about 100 Å, and is preferably deposited by PVD. In applications where Ti is the barrier layer 27, the insulating layer 22 may be formed in the PVD chamber immediately following deposition of the Ti barrier layer before the substrate is moved to the CVD chamber by introducing oxygen into the PVD chamber.

A thin self aligning nucleation layer 25 may be deposited on insulating layer 22 on the field of the substrate prior to the selective deposition step using techniques described in co-pending and commonly assigned U.S. patent application Ser. No. 08/622,941, which is incorporated herein by reference, to overcome loss of selectivity on the field by providing controlled deposition of a subsequent metal layer on the field and to provide improved morphology and texture of the deposited metal layer. The thin, self aligning nucleation layer 25 can be deposited by sputtering a nucleation material, such as Ti, TiN, Al, Cu, Si, Nb, Ta, aluminum silicates, silica, high alumina and combinations thereof, for 20–200 W/s to form nucleation sites on the field of the substrate where nucleation of the subsequent CVD metal proceeds at a controlled rate and in a highly oriented manner. The self-aligning layer preferably is only scattered atoms or a thin blanket of nucleation material only a few Å thick.

It is also preferred that the metal layer include at least trace amounts of copper (Cu) or other dopant material. This can accomplished by using an AlCu target to deposit a PVD AlCu layer on the CVD metal layer. When the PVD AlCu sequentially follows CVD Al in an integrated process having a PVD and CVD chamber on the same cluster tool, an oxide layer cannot form therebetween and the PVD AlCu layer grows epitaxially on the CVD Al layer without grain boundaries, i.e., uniform crystal structure throughout both layers. Furthermore, the sequential CVD Al/PVD AlCu process allows the intermixed layer to be annealed at about 300° C. for about 15 minutes to achieve substantially uniform distribution of Cu in the CVD/PVD layers. It is also preferred that the top surface of the intermixed CVD/PVD Al layer receive a PVD TiN anti-reflection coating ("ARC") for reducing the reflectivity of the surface and improving the photolithographic performance of the layer.

In an alternative embodiment, a warm PVD metal layer, preferably >250° C., may be deposited over the previously formed CVD metal layer instead of the thin, self-aligning nucleation layer 25. The warm PVD layer forms a planarized blanket metal layer over the CVD selective layer to overcome loss of selectivity on the field due to defects. The method of depositing a warm PVD metal layer is described in co-pending U.S. patent application Ser. No. 08/638,762, entitled "Process for Overcoming CVD Al Selectivity Loss With Warm PVD Al," commonly assigned to Applied Materials, Inc., which is incorporated herein by reference. The planarized metal PVD layer is preferably formed at a process temperature greater than about 150° C., most preferably greater than about 250° C. To achieve the planarization of the blanket metal film over the selective CVD film, the PVD metal film preferably immediately follows the CVD metal film. The grain growth of the PVD metal layer formed at temperatures greater than about 250° C. exhibit grain growth which absorbs the nodules or other defects that are formed on the field of the substrate during CVD metal deposition to form a highly oriented metal blanket layer. The warm PVD metal layer may include trace amounts of copper or other dopant.

Figure 3:
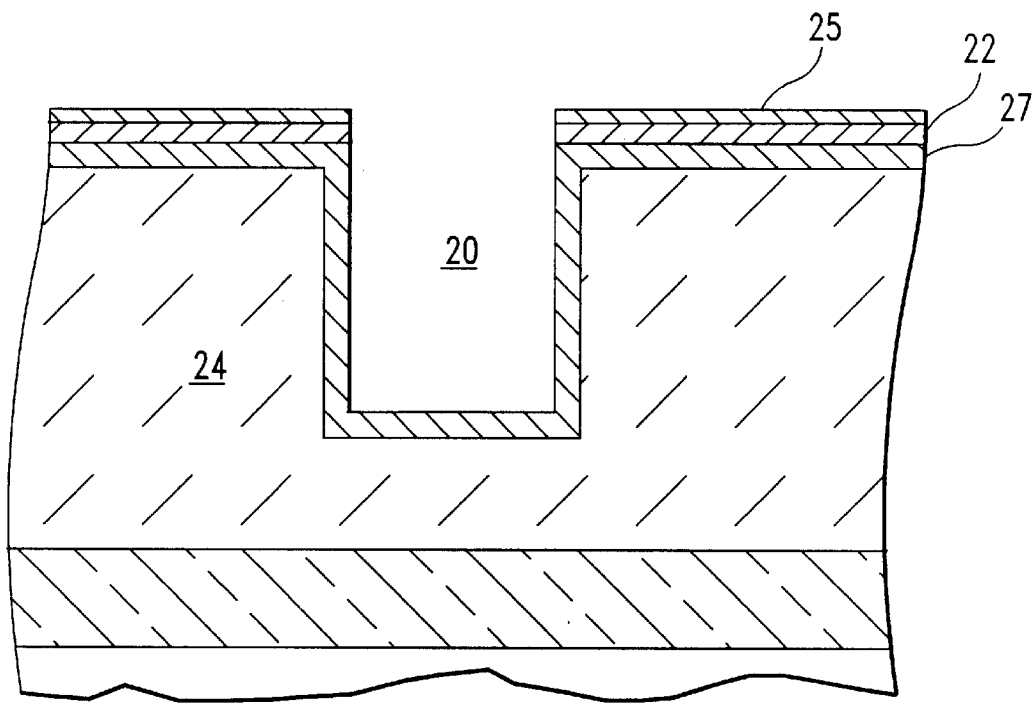
FIG. 3 is a schematic partial sectional view of the substrate of FIG. 2 showing an insulating layer deposited on the barrier layer on the field of the substrate.

A schematic of a multichamber processing apparatus 35 suitable for performing the CVD process of the present invention, is illustrated in FIG. 3a The apparatus is an "ENDURA" system commercially available from Applied Materials, Santa Clara, Calif. The particular embodiment of the apparatus 35 shown herein is suitable for processing planar substrates 20, such as semiconductor substrates, and is provided to illustrate the invention, and should not be used to limit the scope of the invention. The apparatus 35 typically comprises a cluster of interconnected process chambers, for example, CVD and PVD deposition and rapid thermal annealing chambers.

The apparatus 35 includes at least one enclosed PVD deposition chamber 36 for performing PVD processes, such as sputtering. The PVD chamber 36 comprises a sputtering target (not shown) of sputtering material facing the substrate 20. The target is electrically isolated from the chamber and serves as a process electrode for generating a sputtering plasma. During the sputtering process, a sputtering gas, such as argon or xenon, is introduced into the chamber 36. An RF bias current is applied to the sputtering target, and the support supporting the substrate in the chamber is electrically grounded. The resultant electric field in the chamber 36 ionizes sputtering gas to form a sputtering plasma that sputters the target causing deposition of material on the substrate. In sputtering processes, the plasma is typically generated by applying a DC or RF voltage at a power level of from about 100 to about 20,000 Watts, and more typically from about 100 to 10,000 Watts, to the sputtering target.

Figure 6:
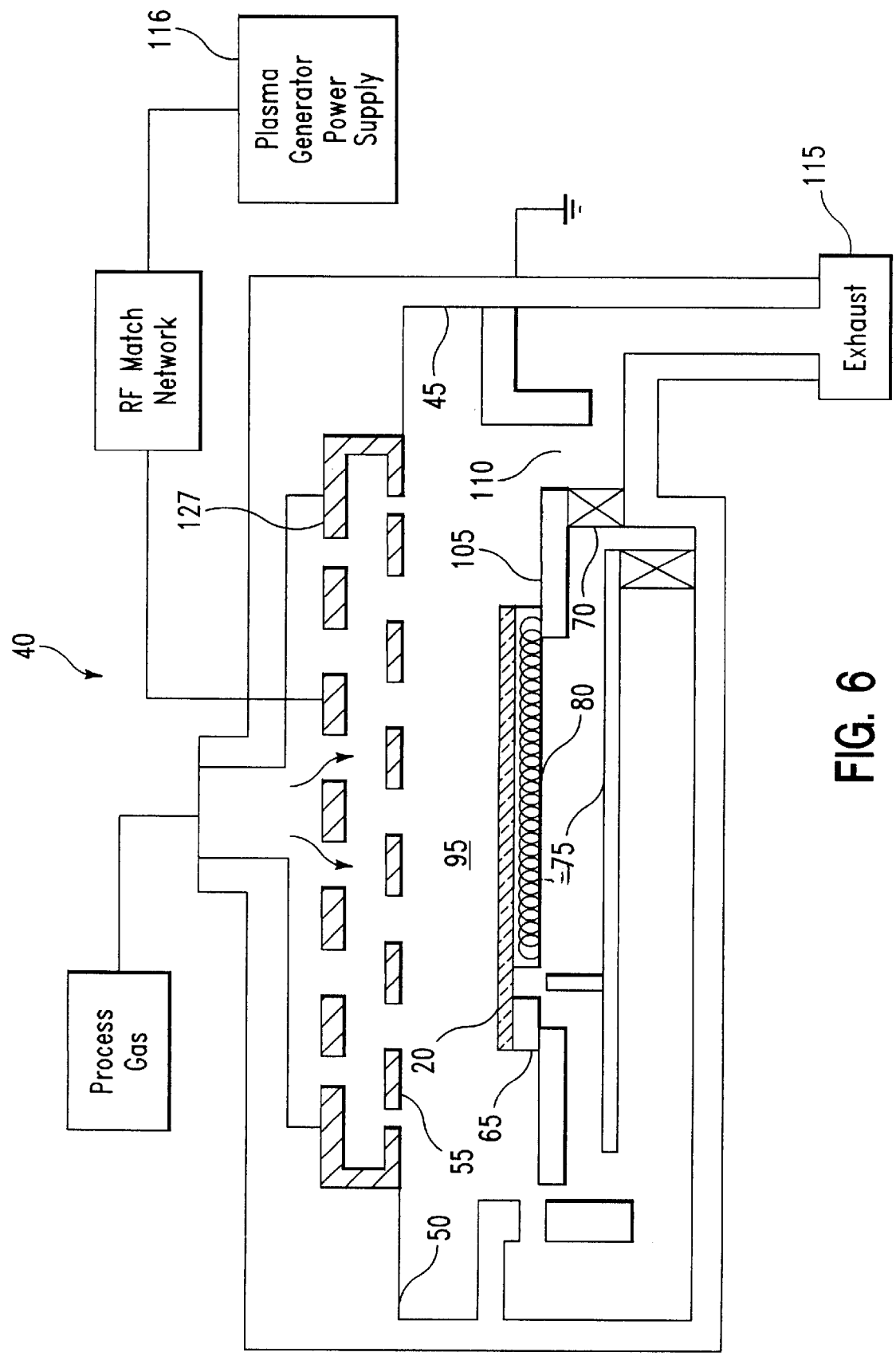
FIG. 6 is a schematic partial sectional view of a CVD deposition chamber suitable for performing the CVD deposition processes of the present invention.
Figure 7:
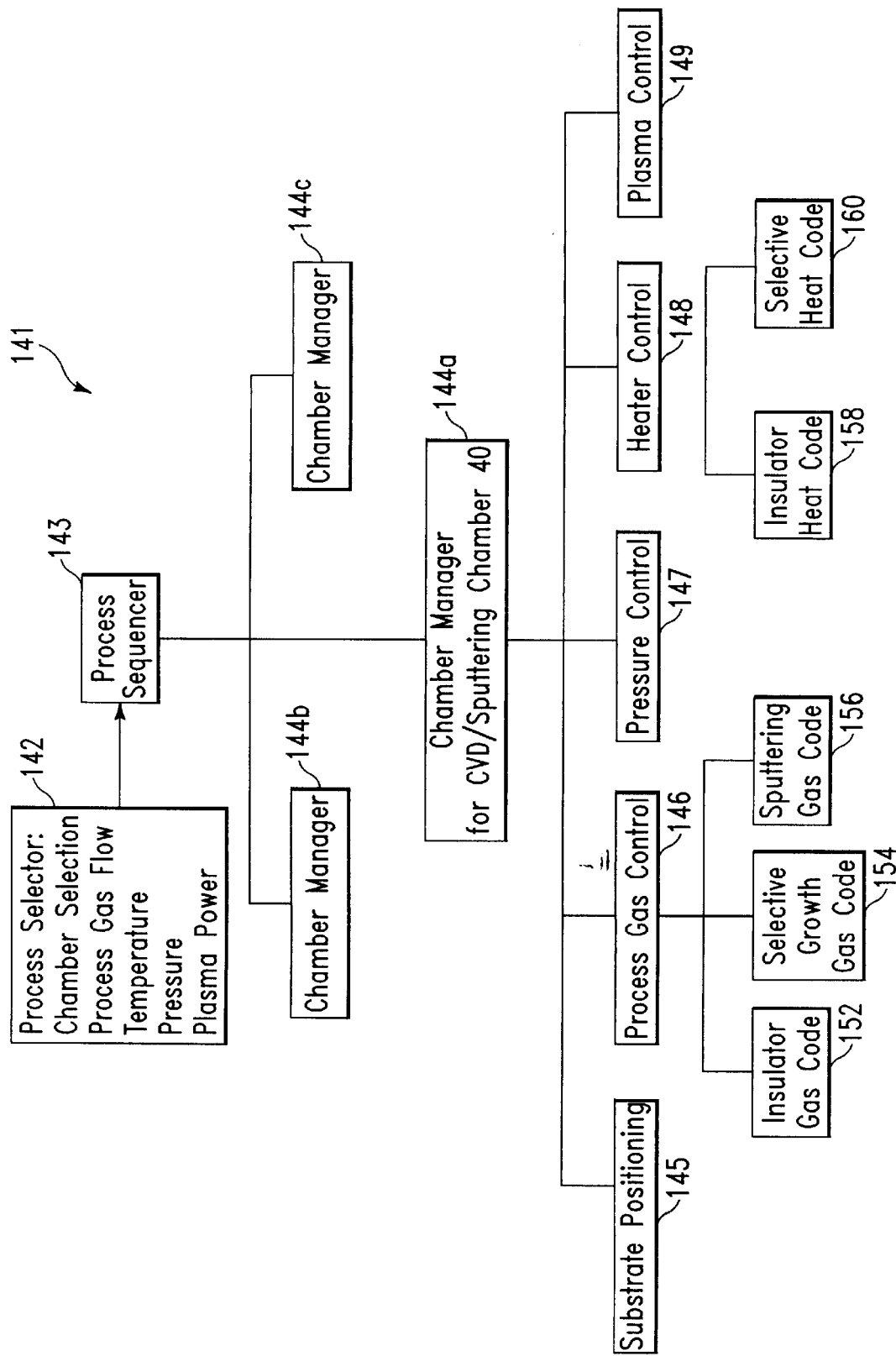
FIG. 7 is a simplified block diagram showing the hierarchical control structure of a computer program of the present invention.

The apparatus also comprises a CVD deposition chamber 40 (shown in FIG. 6) having surrounding sidewalls 45 and a ceiling 50. The chamber 40 comprises a process gas distributor 55 for distributing process gas. Mass flow controllers and air operated valves are used to control the flow of process gas into the deposition chamber 40. The gas distributor 55 is typically mounted above the substrate (as shown), or peripherally about the substrate 20 (not shown). A support 65 is provided for supporting the substrate in the deposition chamber 40. The substrate 20 is introduced into the chamber 40 through a substrate loading inlet in the sidewall 45 of the chamber 40 and placed on the support 65. The support 65 can be lifted or lowered by support lift bellows 70 so that the gap between the substrate 20 and gas distributor 55 can be adjusted. A lift finger assembly 75 comprising lift fingers that are inserted through holes in the support 65 can be used to lift and lower the substrate 20 onto the support to facilitate transport of the substrate 20 into and out of the chamber 40. A thermal heater 80 is then provided in the chamber to rapidly heat the substrate 20. Rapid heating and cooling of the substrate is preferred to increase processing throughput, and to allow rapid cycling between successive processes operated at different temperatures within the same chamber 65. The temperature of the substrate 20 is generally estimated from the temperature of the support 65 that is measured using a substrate 20.

The substrate 20 is processed in a process zone 95 above a horizontal perforated barrier plate 105. The barrier plate 105 has exhaust holes 110 which are in fluid communication with an exhaust system 115 for exhausting spent process gas from the chamber 40. A typical exhaust system 115 comprises a rotary vane vacuum pump (not shown) capable of achieving a minimum vacuum of about 10 mTorr, and optionally a scrubber system for scrubbing byproduct gases. The pressure in the chamber 40 is sensed at the side of the substrate 20 and is controlled by adjusting a throttle valve in the exhaust system 115.

A plasma generator 116 is provided for generating a plasma in the process zone 95 of the chamber 40 for plasma enhanced chemical vapor deposition processes. The plasma generator 116 can generate a plasma (I) inductively by applying an RF current to an inductor coil encircling the deposition chamber (not shown), (ii) capacitively by applying an RF current to process electrodes in the chamber, or (iii) both inductively and capacitively while the chamber wall or other electrode is grounded. A DC or RF current at a power level of from about 750 Watts to about 2000 Watts can be applied to an inductor coil (not shown) to inductively couple energy into the deposition chamber to generate a plasma in the process zone 95. When an RF current is used, the frequency of the RF current is typically from about 400 KHZ to about 16 MHZ, and more typically about 13.56 MHZ. Optionally, a gas containment or plasma focus ring (not shown), typically made of aluminum oxide or quartz, can be used to contain the flow of process gas or plasma around the substrate 20.

The process can be implemented using a computer program product 141 that runs on a conventional computer system comprising a central processor unit (CPU) interconnected to a memory system with peripheral control components, such as for example a 68400 microprocessor, commercially available from Synenergy Microsystems, California The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 4:
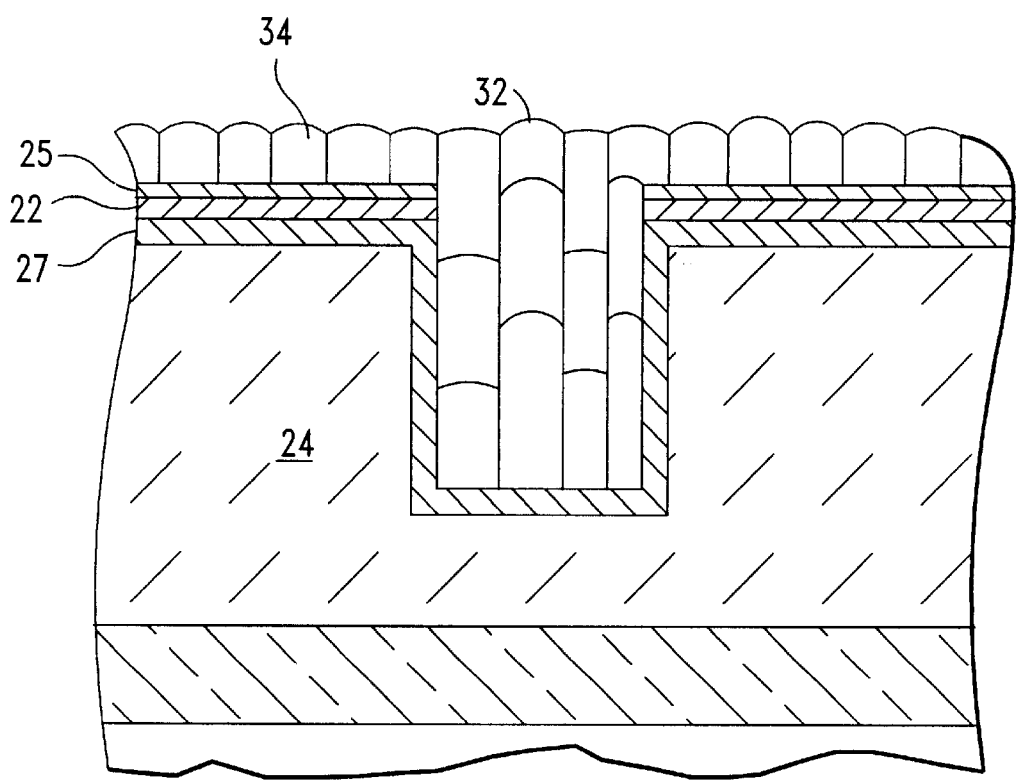
FIG. 4 is a schematic partial sectional view of the substrate of FIG. 3 showing a thin self-aligning nucleation layer deposited on the insulating layer.
Figure 5:
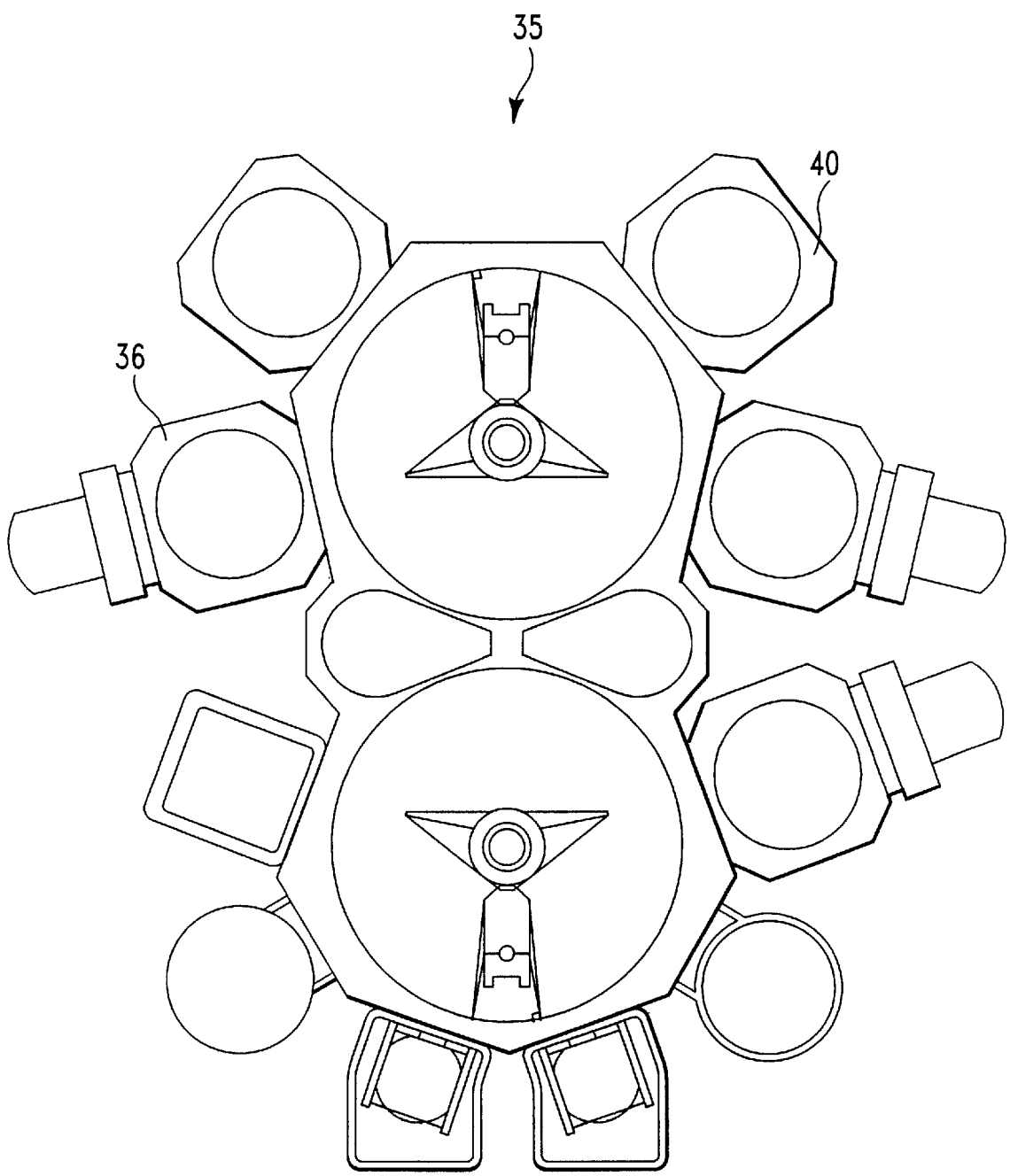
FIG. 5 is a schematic partial sectional view of an integrated multi-chamber apparatus suitable for performing CVD and PVD processes on a substrate.

FIG. 4 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process set the desired process chamber, and (ii) the desired set of process parameter needed to operate the process chamber for performing a particular process. The process parameters relate to process conditions such as, for example, process gas composition and flow rates, temperature, pressure, plasma conditions such as RF bias power levels and magnetic field power levels, cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (I) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to chamber manager subroutines 144a–c which control multiple processing tasks in different process chambers according to the process set determined by the sequencer subroutine 143. For example, the chamber manager subroutine 144a comprises program code for controlling CVD process operations, within the described process chamber 40. The chamber manager subroutine 144 also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149. These different subroutines function as seeding program code means for (I) heating the substrate 20 to temperatures $T_s$ within a range of temperatures $\Delta T_s$, and (ii) introducing a reaction gases into the process zone to deposit a substantially continuous insulating layer on the field portions of the substrate; and deposition growth program code means for (I) maintaining the substrate 20 at a deposition temperatures $T_d$ within a range of temperature $\Delta T_d$, and (ii) introducing deposition gas into the process zone to form an epitaxial growth layer that is grown in the contact holes or vias. Those having ordinary skill in the art would readily recognize that other chamber control subroutines can be included depending on what processes are desired to be performed in the process chamber 40.

In operation, the chamber manager subroutine 144a selectively schedules or calls the process component subroutines in accordance within the particular process set being executed. The chamber manager subroutine 144a schedules the process component subroutines similarly how the sequencer subroutine 143 schedules which process chamber 40 and process set is to be executed next. Typically, the chamber manager subroutine 144a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described. The substrate positioning code or subroutine 145 comprises program code for controlling chamber components that are used to load the substrate 20 onto the chamber support 65, and optionally to lift the substrate to a desired height in the chamber 40 to control the spacing between the substrate and the gas distributor 55. When a substrate 20 is loaded into the process chamber 40, the substrate support 65 is lowered to receive the substrate, and thereafter, the support is raised to the desired height in the chamber. The substrate positioning subroutine 145 controls movement of the support 65 in response to the process set parameters related to the support height that are transferred from the chamber manager subroutine 144a.

The process gas control subroutine 146 has program code for controlling process gas composition and flow rates. Generally, the process gases supply lines for each of the process gases, include (I) safety shut-off valves (not shown) that can be used to automatically or manually shut off the flow of process gas into the chamber, and (ii) mass flow controllers (also not shown) that measure the flow of a particular gas through the gas supply lines. When toxic gases are used in the process, the several safety shut-off valves are positioned on each gas supply line in conventional configurations. The process gas control subroutine 146 controls the open/close portion of the safety shut-off valves, and also ramps up/down the mass flow controllers to obtain the desired gas flow rate. The process gas control subroutine 146 is invoked by the chamber manager subroutine 144a, as are all chamber component subroutines, and receives from the chamber manager subroutine process parameters related to the desired gas flow rates. Typically, the process gas control subroutine 146 operates by opening the gas supply lines, and repeatedly (I) reading the necessary mass flow controllers, (ii) comparing the readings to the desired flow rates received from the chamber manager subroutine 144a, and (iii) adjusting the flow rates of the gas supply lines as necessary. Furthermore, the process gas control subroutine 146 includes steps for monitoring the gas flow rates for unsafe rates, and activating the safety shut-off valves when an unsafe condition is detected.

The process gas control subroutine 146 comprises deposition via program code for operating the chamber in a preferential field growth mode or a selective growth mode. In the preferential field growth stage, the reactant gas program code 152 flows reactant gas into the chamber 40 for an amount of time necessary to form a thin insulating layer on the substrate 20. Thereafter, in the selective deposition growth stage, the deposition gas program code 154 flows deposition gas into the chamber 40 for an amount of time necessary to grow the desired selective growth layer on the contact holes or vias and on the field. Sputtering gas program code 156 can also be provided to introduce sputtering gas into the PVD chamber 36 during performance of the PVD process step.

The process gas can be formed from a gas or liquid precursor. When a process gas is vaporized from a liquid precursor, for example dimethyl aluminum hydride (DMAH), the process gas control subroutine 146 is written to include steps for bubbling a carrier gas such as hydrogen, argon, or helium, through the liquid precursor in a bubbler assembly. For this type of process, the process gas control subroutine 146 regulates the flow of the carrier gas, the pressure in the bubbler, and the bubbler temperature in order to obtain the desired process gas flow rates. As discussed above, the desired process gas flow rates are transferred to the process gas control subroutine 146 as process parameters. Furthermore, the process gas control subroutine 146 includes steps for obtaining the necessary carrier gas flow rate, bubbler pressure, and bubbler temperature for the desired process gas flow rate by accessing a stored table containing the necessary values for a given process gas flow rate. Once the necessary values are obtained, the carrier gas flow rate, bubbler pressure and bubbler temperature are monitored, compared to the necessary values, and adjusted pressure in the chamber 40 by regulating the size of the opening of the throttle valve in the exhaust system 115 of the chamber. The opening size of the throttle valve is set to control the chamber pressure to the desired level in relation to the total process gas flow, size of the process chamber, and pumping setpoint pressure for exhaust system 115.

When the pressure control subroutine 147 is invoked, the desired or target pressure level is received as a parameter from the chamber manager subroutine 144a. The pressure control subroutine 147 operates to measure the pressure in the chamber 40 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 147 can be written to open or close the throttle valve to a particular opening size to regulate the chamber 40 at the desired pressure.

The heater control subroutine 148 comprises program code for controlling the temperature of the heater 80 used to heat the substrate 20. The heater control subroutine 148 includes seeding stage heating program code 158 for operating in a seeding stage in which the substrate is maintained at a desired seeding temperatures $T_s$ within the range of temperatures $\Delta T_s$. Typically, the subroutine 148 is programmed to ramp up the temperature of the support from ambient chamber temperatures to a set point temperature. When the substrate reaches the seeding temperatures $T_s$, the process gas control subroutine 146 is programmed to introduce seeding gas into the chamber, as described above. The heater control subroutine 148 also comprises epitaxial growth heating program code 160 for rapidly heating the substrate to deposition temperatures $T_d$ within a range of temperatures $\Delta T_D$ that are suitable for growing an epitaxial growth layer on the seeding layer. In this step, the heater control subroutine 148 is invoked by the chamber manager subroutine 144a and receives a ramp rate temperature parameter of at least about 50° C./min.

The heater control subroutine 148 measures temperature by measuring voltage output of a thermocouple located in the support, compares the measured temperature to the setpoint temperature, and increases or decreases current applied to the heater 80 to obtain the desired ramp rate or setpoint temperature. The temperature is obtained from the measured voltage by looking up the corresponding temperature in a stored conversion table, or by calculating the temperature using a fourth order polynomial. When radiant lamps are used as the heater 80, the heater control subroutine 148 gradually controls a ramp up/down of current applied to the lamp that increases the life and reliability of the lamp. Additionally, a built-in fail-safe mode can be included to detect process safety compliance, and to shut down operation of the heater 80 if the process chamber 40 is not properly set up.

The plasma control subroutine 149 comprises program code for forming a deposition plasma in the chamber during operation of the chamber in a chemical vapor deposition mode. The subroutine 149 sets the RF bias voltage power level applied to the process electrodes 60, 65 in the chamber 40, and optionally sets the level of the magnetic field generated in the chamber, to form the deposition plasma. Similar to the previously described chamber component subroutines, the plasma control subroutine 149 is invoked by the chamber manager subroutine 144a. In operation, the plasma condition 149 includes steps for reading both "forward" power applied to the plasma generator 116, and "reflected" power flowing through the chamber 40. An excessively high reflected power reading indicates that the plasma has not been ignite, and the plasma control subroutine 149 restarts or shuts down the process. The read power levels are compared against target levels, and the current is adjusted to control the plasma for applying a sinusoidal wave current to the generator to form a rotating magnetic field in the chamber 40. The sinusoidal wave needed to generate a desired magnetic field can be obtained from a stored table of sinusoidal values corresponding to magnetic field strengths, or calculated using a sinusoidal equation.

While the foregoing is directed to the preferred embodiment of the present invention, other and further embodiments of the invention may be devised without departing from the basic scope thereof. The scope of the invention is determined by the claims which follow.

What is claimed is:

1. A computer program product for operating a process chamber, the computer program product comprising a computer usable medium having computer readable program code for conducting a process comprising:

depositing a barrier layer on the substrate, wherein the barrier layer comprises a material that nucleates deposition of conductive or semi-conductive materials;

depositing an insulating layer on the barrier layer on a field surface of the substrate, wherein the field surface surrounds one or more apertures formed on the substrate, so that the barrier layer is covered by the insulating layer on the field surface and is exposed in the apertures; and then depositing a conducting or semi-conducting layer on the barrier layer within the apertures by chemical vapor deposition.

2. The computer program product of claim 1, further comprising computer program code for depositing a nucleation layer on the insulating layer prior to depositing the conducting or semi-conducting layer, wherein the nucleation layer is comprised of a material selected from the group consisting of Ti, TiN, Al, Cu, Si, Nb, Ta, aluminum silicates, silica, high alumina, and combinations thereof.

3. The computer program product of claim 2, wherein the insulating layer is comprised of a material selected from the group consisting of aluminum nitrides, titanium oxides, silicon nitrides, and combinations thereof, and the conducting layer is comprised of a material selected from the group consisting of Al, Cu, and combinations thereof.

4. The computer program product of claim 1, further comprising computer program code for depositing a warm metal layer over the conducting or semi-conducting layer at a temperature greater than 250° C.

5. The computer program product of claim 1, further comprising computer program code for depositing a dopant material on the conducting or semi-conducting layer.

6. A computer program product for operating a process chamber, the computer program product comprising a computer usable medium having computer readable program code for conducting a process comprising:
   depositing a barrier layer on the substrate, wherein the barrier layer comprises a material that nucleates deposition of conductive or semi-conductive materials;
   depositing an intermediate layer on the barrier layer on a field surface of the substrate, wherein the field surface surrounds apertures formed on the substrate, so that the barrier layer is covered by the insulating layer on the field surface and is exposed in the apertures;
   exposing the intermediate layer to one or more gases to form an insulating layer; and then
      depositing a conducting or semi-conducting layer on the barrier layer within the apertures.

7. The computer program product of claim 6, further comprising computer program code for depositing a nucleation layer on the insulating layer, wherein the nucleation layer is comprised of a material selected from the group consisting of Ti, TiN, Al, Cu, Si, Nb, Ta, aluminum silicates, silica, high alumina, and combinations thereof.

8. The computer program product of claim 7, wherein the insulating layer is comprised of a material selected from the group consisting of aluminum nitrides, titanium oxides, silicon nitrides, and combinations thereof, and the conducting layer is comprised of a material selected from the group consisting of Al, Cu, and combinations thereof.

9. The computer program product of claim 7, further comprising computer program code for depositing a dopant material on the conducting layer.

10. The computer program product of claim 9, further comprising computer program code for depositing a warm metal layer over the conducting layer at a temperature greater than 250° C.

11. A computer program product for operating a process chamber, the computer program product comprising a computer usable medium having computer readable program code for conducting a process comprising:
   depositing a barrier layer on exposed surfaces of the patterned substrate, wherein the barrier layer comprises Ti, TiN, or Al;
   depositing an insulating layer on the barrier layer on a field surface of the substrate, wherein the field surface surrounds apertures formed on the substrate, so that the barrier layer is covered by the insulating layer on the field surface and is exposed in the apertures and the insulating layer comprises a material selected from a group consisting of aluminum nitrides, titanium oxides, silicon nitrides, and combinations thereof; and
   depositing a conducting or semi-conducting layer on the barrier layer in the apertures.

12. The computer program product of claim 11, wherein the depositing an insulating layer comprises depositing an intermediate layer onto the field surface of the substrate and exposing the intermediate layer to one or more reactive gases.

13. The computer program product of claim 11, wherein the insulating layer and the conducting or semi-conducting layer are deposited in one process zone.

14. The computer program product of claim 11, wherein the conducting layer comprises a material selected from the group consisting of Al, Cu, and combinations thereof.

15. The computer program product of claim 12, wherein the patterned substrate comprises contacts or vias and the field surface surrounds the contacts or the vias.

16. The computer program product of claim 15, further comprising computer program code for depositing a nucleation layer on the insulating layer.

17. The computer program product of claim 16, wherein the nucleation layer is comprised of a material selected from the group of Ti, TiN, Al, Cu, Si, Nb, Ta, aluminum silicates, silica, high alumina, and combinations thereof.

18. The computer program product of claim 15, further comprising computer program code for depositing a second conducting layer at a temperature greater than 250° C. over the conducting layer.

19. The computer program product of claim 15, wherein the conducting layer is comprised of a material selected from the group consisting of Al, Cu and combinations thereof.

20. The computer program product of claim 15, further comprising program code for depositing a dopant material on the conducting layer.

* * * * *